United States Patent
Baek et al.

(10) Patent No.: US 9,646,960 B2
(45) Date of Patent: May 9, 2017

(54) SYSTEM-ON-CHIP DEVICES AND METHODS OF DESIGNING A LAYOUT THEREFOR

(71) Applicant: SAMSUNG ELECTRONICS CO., LTD., Suwon-si, Gyeonggi-do (KR)

(72) Inventors: Sanghoon Baek, Seoul (KR); Jung-Ho Do, Yongin-si (KR); Taejoong Song, Seongnam-si (KR); Giyoung Yang, Seoul (KR); Seungyoung Lee, Incheon (KR); Jinyoung Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/046,200

(22) Filed: Feb. 17, 2016

(65) Prior Publication Data

US 2016/0254256 A1 Sep. 1, 2016

Related U.S. Application Data

(60) Provisional application No. 62/120,919, filed on Feb. 26, 2015.

(30) Foreign Application Priority Data

Jul. 8, 2015 (KR) ........................ 10-2015-0097306

(51) Int. Cl.
*H01L 27/02* (2006.01)
*H01L 27/088* (2006.01)
*H01L 27/11* (2006.01)
*H01L 23/528* (2006.01)
*H01L 23/522* (2006.01)

(52) U.S. Cl.
CPC ...... *H01L 27/0207* (2013.01); *H01L 23/5226* (2013.01); *H01L 23/5283* (2013.01); *H01L 27/088* (2013.01); *H01L 27/1104* (2013.01)

(58) Field of Classification Search
CPC ............. H01L 27/0207; H01L 23/5226; H01L 23/5283
See application file for complete search history.

(56) References Cited

U.S. PATENT DOCUMENTS

| | | | |
|---|---|---|---|
| 4,760,349 | A | 7/1988 | Park et al. |
| 7,046,522 | B2 | 5/2006 | Sung et al. |
| 8,178,909 | B2 | 5/2012 | Venkatraman et al. |

(Continued)

FOREIGN PATENT DOCUMENTS

JP    2014-029903 A    2/2014

*Primary Examiner* — Karen Kusumakar
(74) *Attorney, Agent, or Firm* — Volentine & Whitt, PLLC

(57) ABSTRACT

A system-on-chip device may include a substrate with an active pattern, a gate electrode crossing the active pattern and extending in a first direction, and a first metal layer electrically connected to the active pattern and the gate electrode. The first metal layer may include a first metal line extending in the first direction and a second metal line spaced apart from the first metal line in the first direction to extend in a second direction crossing the first direction. The first and second metal lines may include first and second sidewalls parallel to the second direction, the first and second sidewalls may face each other, and the first sidewall may have a length that is two or three times a minimum line width.

19 Claims, 16 Drawing Sheets

(56) References Cited

U.S. PATENT DOCUMENTS

| | | |
|---|---|---|
| 8,188,549 B2 | 5/2012 | Ishii |
| 8,710,552 B2 | 4/2014 | Tsuda et al. |
| 8,872,283 B2 | 10/2014 | Becker et al. |
| 8,941,150 B2 | 1/2015 | Sherlekar et al. |
| 9,105,466 B2 | 8/2015 | Lu et al. |
| 9,122,830 B2 | 9/2015 | Yuan et al. |
| 2009/0228853 A1* | 9/2009 | Hong ............... G06F 17/5068 716/119 |
| 2013/0075762 A1* | 3/2013 | Nakamura ...... H01L 31/022425 257/81 |
| 2014/0327050 A1* | 11/2014 | Hsieh ............... G06F 17/5072 257/208 |

\* cited by examiner

2000

3000

SYSTEM-ON-CHIP DEVICES AND METHODS OF DESIGNING A LAYOUT THEREFOR

CROSS-REFERENCE TO RELATED APPLICATIONS

This U.S. non-provisional patent application claims priority under 35 U.S.C. §119 from U.S. Provisional Patent application Ser. No. 62/120,919, filed on Feb. 26, 2015 in the United States Patent and Trademark Office, and Korean Patent Application No. 10-2015-0097306, filed on Jul. 8, 2015 in the Korean Intellectual Property Office, the entire contents of which are hereby incorporated by reference.

BACKGROUND OF THE DISCLOSURE

Example embodiments of the disclosure relate to a system-on-chip device and a method of designing a layout therefor, and in particular, to a system-on-chip device including a plurality of standard cells and a method of designing a layout for metal layers provided thereon.

Due to their small-sized, multifunctional, and/or low-cost characteristics, semiconductor devices are being esteemed as important elements in the electronic industry. The semiconductor devices may be classified into a memory device for storing data, a logic device for processing data, and a hybrid device including both of memory and logic elements. To meet the increased demand for electronic devices with fast speed and/or low power consumption, it is necessary to realize semiconductor devices with high reliability, high performance, and/or multiple functions. To satisfy these technical requirements, complexity and/or integration density of semiconductor devices are being increased. The semiconductor devices may be generally classified into a memory device for storing data, a logic device for processing data, and a system-on-chip (SoC) device including both of memory and logic elements.

SUMMARY

Example embodiments of the disclosure provide a system-on-chip device, in which a standard cell with a reduced height is provided.

Other example embodiments of the disclosure provide a method of designing a layout for a system-on-chip device, in which a standard cell with a reduced height is provided.

According to example embodiments of the disclosure, a system-on-chip device may include a substrate with an active pattern, a gate electrode crossing the active pattern and extending in a first direction parallel to a top surface of the substrate, and a first metal layer electrically connected to the active pattern and the gate electrode. The first metal layer may include a first metal line extending in the first direction, and a second metal line spaced apart from the first metal line in the first direction to extend a second direction crossing the first direction. The first metal line may include a first sidewall parallel to the second direction, the second metal line may include a second sidewall parallel to the second direction, the first sidewall and the second sidewall may face each other, and the first sidewall may have a length that is two or three times a minimum line width.

In some embodiments, the minimum line width may be a minimum width, in the first direction, of the second metal line.

In some embodiments, the first metal layer may further include a third metal line extending in the second direction, the second metal line and the third metal line may be spaced apart from each other in the first direction by a first distance, and the first sidewall and the second sidewall may be spaced apart from each other by a second distance that is in a range from about 1 to about 1.2 times the first distance.

In some embodiments, the first metal layer may include a third metal line extending in the second direction and a fourth metal line spaced apart from the third metal line in the first direction to extend in the first direction. Here, the third metal line may include a third sidewall parallel to the second direction, the fourth metal line may include a fourth sidewall parallel to the second direction, the third sidewall and the fourth sidewall may face each other, the fourth sidewall may have a length shorter than that of the first sidewall, the first sidewall and the second sidewall may be spaced apart from each other by a second distance, and the third sidewall and the fourth sidewall may be spaced apart from each other by a third distance greater than the second distance.

In some embodiments, the device may further include a second metal layer on the first metal layer. The second metal layer may include fifth metal lines extending in the first direction and parallel to each other, and one of the fifth metal lines may be electrically connected to the first metal line to provide pin areas for a routing.

In some embodiments, the second metal line may include a plurality of second metal line patterns spaced apart from each other in the first direction, and another of the fifth metal lines may be disposed to electrically connect the second metal line patterns spaced apart from each other.

In some embodiments, the device may further include a third metal layer on the second metal layer. The third metal layer may include sixth metal lines extending in the second direction and parallel to each other, and one of the sixth metal lines may be coupled to one of the pin areas of the fifth metal line and may be electrically connected to the first metal line.

In some embodiments, the device may further include source/drain regions formed in upper portions of the active pattern and at both sides of the gate electrode, and contacts respectively coupled to the gate electrode and the source/drain regions. The first and second metal lines may be electrically connected to the contacts.

According to example embodiments of the disclosure, a layout design method may include providing a layout pattern for forming a system-on-chip device with a plurality of standard cells. The providing of the layout pattern may include providing a first metal layout defining a first metal layer. Here, the first metal layout may include a first metal pattern extending in a first direction and a second metal pattern spaced apart from the first metal pattern in the first direction to extend in a second direction crossing the first direction. The first and second metal patterns may respectively include first and second sidewalls facing each other, and a distance between the first sidewall and the second sidewall may be in a range from about 1 to about 1.2 times a minimum separation distance given by a design rule for a layout.

In some embodiments, a length of the first sidewall may be about 2 to about 3 times a minimum line width given by the design rule.

In some embodiments, a length of the first sidewall may be equal to or greater than a minimum sidewall length, allowing for the first sidewall to be spaced apart from the second sidewall by the minimum separation distance. The length of the first sidewall may be smaller than that of the second sidewall.

In some embodiments, the first metal layout may further include a third metal pattern extending in the first direction and a fourth metal pattern, which is spaced apart from the third metal pattern in the first direction to extend in the second direction. The third and fourth metal patterns may respectively include third and fourth sidewalls facing each other, a length of the third sidewall may be smaller than that of the first sidewall, and a distance between the third and fourth sidewalls may be greater than a distance between the first and second sidewalls.

In some embodiments, the length of the third sidewall may be in a range from about 1 to about 2 times a minimum line width given by the design rule.

In some embodiments, the providing of the layout pattern may further include providing a second metal layout defining a second metal layer and providing a third metal layout defining a third metal layer, and the first to third metal layers may be sequentially stacked on a substrate. The second metal layout may include fifth metal patterns extending in the first direction and parallel to each other, the third metal layout may include sixth metal patterns extending in the second direction and parallel to each other, and the first direction may be an extension direction of a gate pattern.

In some embodiments, at least one of the fifth metal patterns may be overlapped with the first metal pattern and may include a plurality of pin areas for a routing.

According to example embodiments of the disclosure, a logic cell includes a substrate with an active pattern for the logic cell and a source/drain electrode crossing the active pattern and extending in a first direction parallel to a top surface of the substrate. The first metal layer may include a first metal line having a first width in the first direction; a second metal line that is spaced apart from the first metal line in the first direction by about a minimum spacing according to a layout design rule and having a second width in the first direction that is about one-third the first width or less and about the same as a minimum line width according to the layout design rule, and a third metal line that is spaced apart from the first metal line on an opposite side of the first metal line with respect to the first direction by the minimum spacing and having the second width in the first direction. The first metal line may be directly and electrically connected to the source/drain electrode through a first via extending through a first insulating layer disposed between the source/drain electrode and the first metal layer. The first metal line may not be electrically connected to either of the second and third metal lines through metal connectivity.

In some embodiments, the logic cell may include a second metal layer disposed over the first metal layer and separated from the first metal layer by a second insulating layer. The second and third metal lines may be directly and electrically connected by the second metal layer and second and third vias extending respectively from each of the second and third metal lines to the second metal layer through the second insulating layer.

In some embodiments, the logic cell may include a third metal layer having a fourth metal line that is directly and electrically connected to the second metal layer through a fourth via extending through a third insulating layer disposed between the second and third metal layers and a fifth metal line that is directly and electrically connected to the first metal line through a fifth via extending through the third insulating layer. The fourth and fifth metal lines may not be electrically connected through metal connectivity.

In some embodiments, the logic cell may include a gate electrode crossing the active pattern in the first direction parallel to the top surface of the substrate. The first metal layer may further include a sixth metal line having the same dimensions and spatial orientation as the first metal line. The first metal line may be directly and electrically connected to a contact of the gate electrode through a sixth via extending through the first insulating layer, which is disposed between the gate electrode and the first metal layer.

In some embodiments, the second metal layer may further include a seventh metal line that is directly and electrically connected to the sixth metal line through a seventh via extending through the second insulating layer. The third metal layer may further include an eighth metal line that is directly and electrically connected to the seventh metal line through an eighth via extending through the third insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
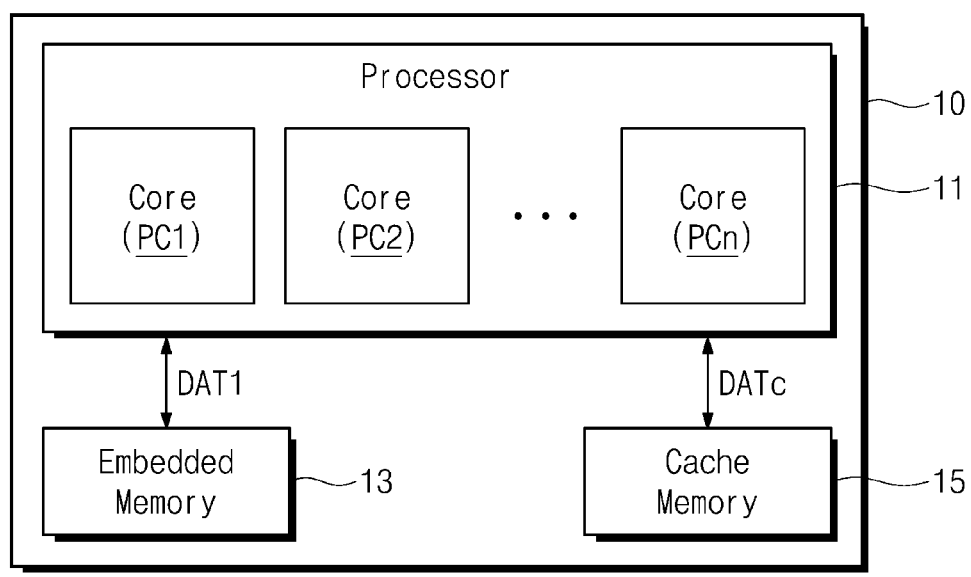
FIG. 1 is a block diagram illustrating an example of an electronic device including a semiconductor device according to example embodiments of the disclosure.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the disclosure will now be described more fully with reference to the accompanying drawings, in which example embodiments are shown. Example embodiments of the disclosure may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the disclosure are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the disclosure should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the disclosure belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating an example of an electronic device including a semiconductor device according to example embodiments of the disclosure.

Referring to FIG. 1, an electronic device 1 may include a semiconductor chip 10. The semiconductor chip 10 may include a processor 11, an embedded memory 13, and a cache memory 15. The semiconductor chip 10 may be provided in the form of a system-on-chip.

The processor 11 may include one or more processor cores PC1-PCn. The one or more processor cores PC1-PCn may be configured to process data and signals. The processor cores PC1-PCn may be configured to include the semiconductor device according to example embodiments of the disclosure (for example, the plurality of logic cells to be described with reference to FIG. 2).

The electronic device 1 may be configured to perform its own functions using the processed data and signals. As an example, the processor 11 may be an application processor.

The embedded memory 13 may exchange first data DAT1 with the processor 11. The first data DAT1 may be data processed, or to be processed, by the one or more processor cores PC1-PCn. The embedded memory 13 may manage the first data DAT1. For example, the embedded memory 13 may be used for a buffering operation on the first data DAT1. In other words, the embedded memory 13 may be operated as a buffer memory or a working memory for the processor 11.

In example embodiments, the electronic device 1 may be used to realize a wearable electronic device. In general, the wearable electronic device may be configured to perform an operation of calculating a small amount of data, rather than calculating a large amount of data. In this sense, in the case where the electronic device 1 is used for a wearable electronic device, the embedded memory 13 may be configured to have a relatively small buffer capacity.

The embedded memory 13 may be a static random access memory (SRAM) device. The SRAM device may have a faster operating speed than that of a dynamic random access memory (DRAM) device. Accordingly, in the case where the SRAM is embedded in the semiconductor chip 10, it is possible for the electronic device 1 to have a small size and a fast operating speed. Furthermore, in the case where the SRAM is embedded in the semiconductor chip 10, it is possible to reduce an active power of the electronic device 1. As an example, the SRAM may include at least one of the semiconductor devices according to example embodiments of the disclosure.

The cache memory 15 may be mounted on the semiconductor chip 10, along with the one or more processor cores PC1-PCn. The cache memory 15 may be configured to store cache data DATc to be used or directly accessed by the one or more processor cores PC1-PCn. The cache memory 15 may be configured to have a relatively small capacity and a very fast operating speed. In example embodiments, the cache memory 15 may include an SRAM device. In the case where the cache memory 15 is used, it is possible to reduce an access frequency or an access time to the embedded memory 13 by the processor 11. In other words, the use of the cache memory 15 may allow the electronic device 1 to have a fast operating speed.

To provide better understanding of example embodiments of the disclosure, the cache memory 15 is illustrated in FIG. 1 to be a component separated from the processor 11. However, the cache memory 15 may be configured to be included in the processor 11. In addition, example embodiments of the disclosure are not limited to the example illustrated by FIG. 1.

The processor 11, the embedded memory 13 and the cache memory 15 may be configured to exchange or transmit data, based on at least one of various interface protocols. For example, the processor 11, the embedded memory 13 and the cache memory 15 may be configured to exchange or transmit data, based on at least one of Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), or Universal Flash Storage (UFS).

Figure 2:
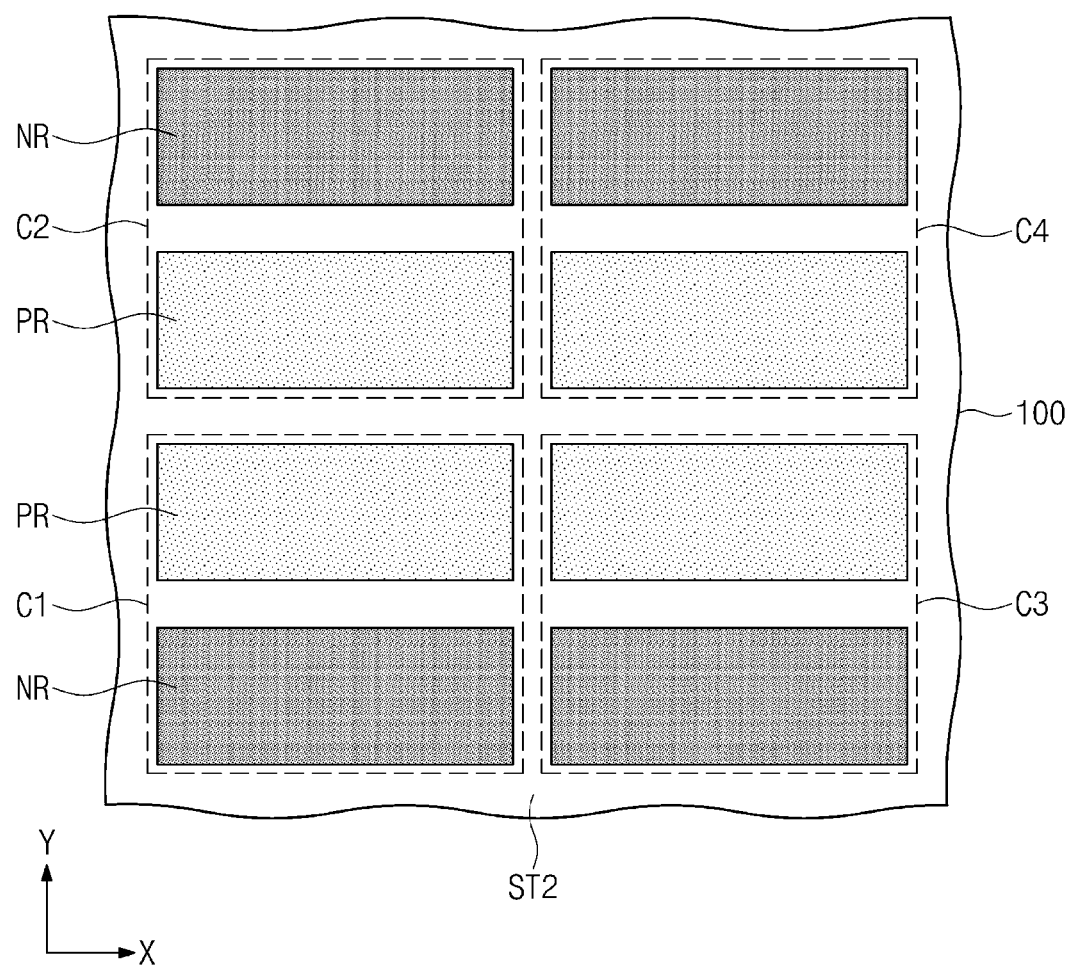
FIG. 2 is a plan view illustrating a semiconductor device according to example embodiments of the disclosure.

FIG. 2 is a plan view schematically illustrating a semiconductor device according to example embodiments of the disclosure.

Referring to FIG. 2, a semiconductor device 100 according to example embodiments of the disclosure may include a plurality of logic cells C1, C2, C3, and C4 provided on a substrate. The plurality of logic cells C1, C2, C3, and C4 may include a plurality of standard cells. Each of the logic cells C1, C2, C3, and C4 may include a plurality of transistors. As an example, the semiconductor device may include a first logic cell C1, a second logic cell C2 spaced apart from the first logic cell C1 in a first direction Y, a third logic cell C3 spaced apart from the first logic cell C1 in a second direction X crossing the first direction Y, and a fourth logic cell C4 spaced apart from the second logic cell C2 in the second direction X. Each of the logic cells C1, C2, C3, and C4 may include active regions spaced apart from each other by second device isolation layers ST2. Each of the logic cells C1, C2, C3, and C4 may include a PMOSFET region PR and an NMOSFET region NR which are spaced apart from each other by the second device isolation layers ST2.

As an example, the PMOSFET and NMOSFET regions PR and NR may be spaced apart from each other in the first direction Y. The PMOSFET region PR of the first logic cell C1 may be disposed adjacent to the PMOSFET region PR of the second logic cell C2 in the first direction Y. In the following description, a term "logic cell" may refer to a unit circuit configured to perform a single logical operation. Further, the number of the logic cells may be variously changed from that illustrated in the drawing.

Figure 3:
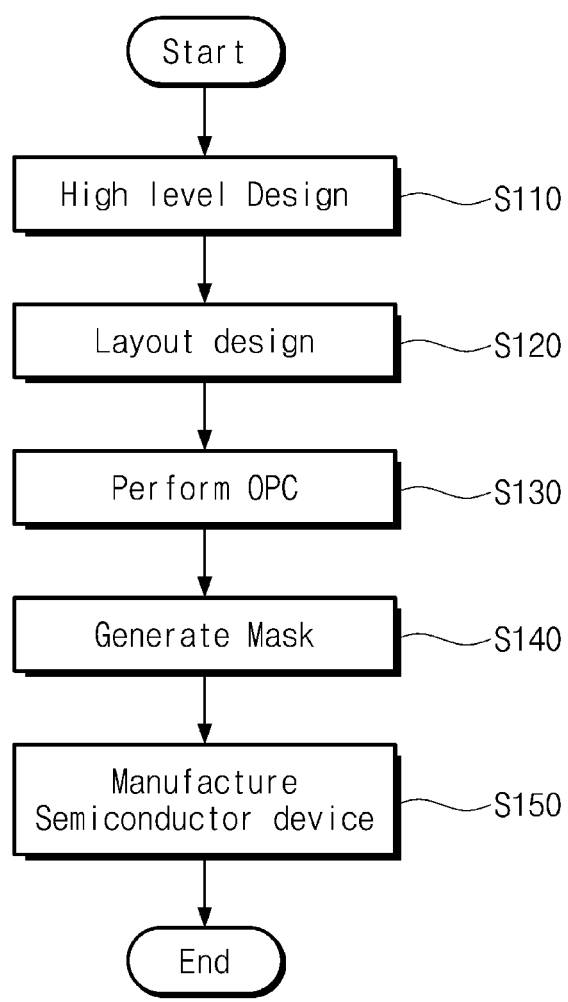
FIG. 3 is a flow chart illustrating methods of designing and fabricating a semiconductor device, according to example embodiments of the disclosure.

FIG. 3 is a flow chart illustrating methods of designing and fabricating a semiconductor device, according to example embodiments of the disclosure.

Referring to FIG. 3, a computer system may be used to perform a high-level design process for a semiconductor integrated circuit (in S110). For example, in the high-level design process, an integrated circuit to be designed may be described in terms of high-level computer language. As an example, the C language may be used as the high-level computer language. Circuits designed by the high-level design process may be more concretely described by a register transfer level (RTL) coding or a simulation. Further, codes generated by the RTL coding may be converted into a netlist, and the results may be combined with each other to wholly describe a semiconductor integrated circuit. The combined schematic circuit may be verified by a simulation tool, and in certain embodiments, an adjusting step may be further performed, depending on the result of the verification step.

A layout design process may be performed to realize a logically complete form of the semiconductor integrated circuit on a silicon wafer (in S120). For example, the layout design process may be performed in consideration of the schematic circuit prepared in the high-level design process or the corresponding netlist. The layout design process may include a routing step of placing and connecting several cells provided from a cell library, based on a predetermined design rule. According to example embodiments of the disclosure, the layout design process may include designing a plurality of metal layouts. The plurality of metal layouts may correspond to a plurality of metal layers sequentially stacked on a silicon wafer. If metal patterns respectively corresponding to the metal layouts are provided, a routing step may be performed to connect data paths.

The cell library for the layout design process may contain information on operation, speed, and power consumption of cells. In certain embodiments, a cell library for representing a layout of a circuit in a gate level may be defined in the layout design tool. Here, the layout may be prepared to define or describe shapes or dimensions of patterns constituting transistors or metal lines, which will be actually formed on a silicon wafer. For example, in order to actually form an inverter circuit on a silicon wafer, it is necessary to prepare or draw a layout for patterns (e.g., PMOS, NMOS, N-WELL, gate line, and metal lines to be provided thereon). For this, a suitable one of inverters contained in the cell library may be selected. In addition, a routing step of connecting the selected or provided cells to each other may be performed. These steps may be automatically or manually performed in the layout design tool.

After the routing step, a verification step of checking whether there is a portion violating the given design rule may be performed on the layout. In some embodiments, the verification step may include evaluating items of a design rule check (DRC), an electrical rule check (ERC), or a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) step may be performed (in S130). By using a photolithography process, it is possible to realize the layout patterns, which are prepared by the layout design process, on a silicon wafer. Here, the OPC step may be performed to correct optical proximity effects, which may occur in the photolithography process. For example, the OPC step may be performed to correct unintended optical effects (such as refraction or diffraction), which may occur in an exposing process using a photomask manufactured based on the layout. As a result of the OPC step, shapes and positions of the patterns may be slightly changed from those described in the layout therefor.

A photomask may be manufactured, based on a layout modified by the OPC step (in S140). In general, the photomask may be manufactured by patterning a chromium layer provided on a glass substrate based on layout pattern data.

A semiconductor device may be fabricated using the manufactured photomask (in S150). The fabrication of the semiconductor device may include repeating exposing and etching processes, and the manufactured photomask may be used for at least one of such exposing processes. In other words, as a result of the processes, it is possible to sequentially form patterns, each of which has a shape described by the layout design process, on a silicon wafer.

Figure 4:
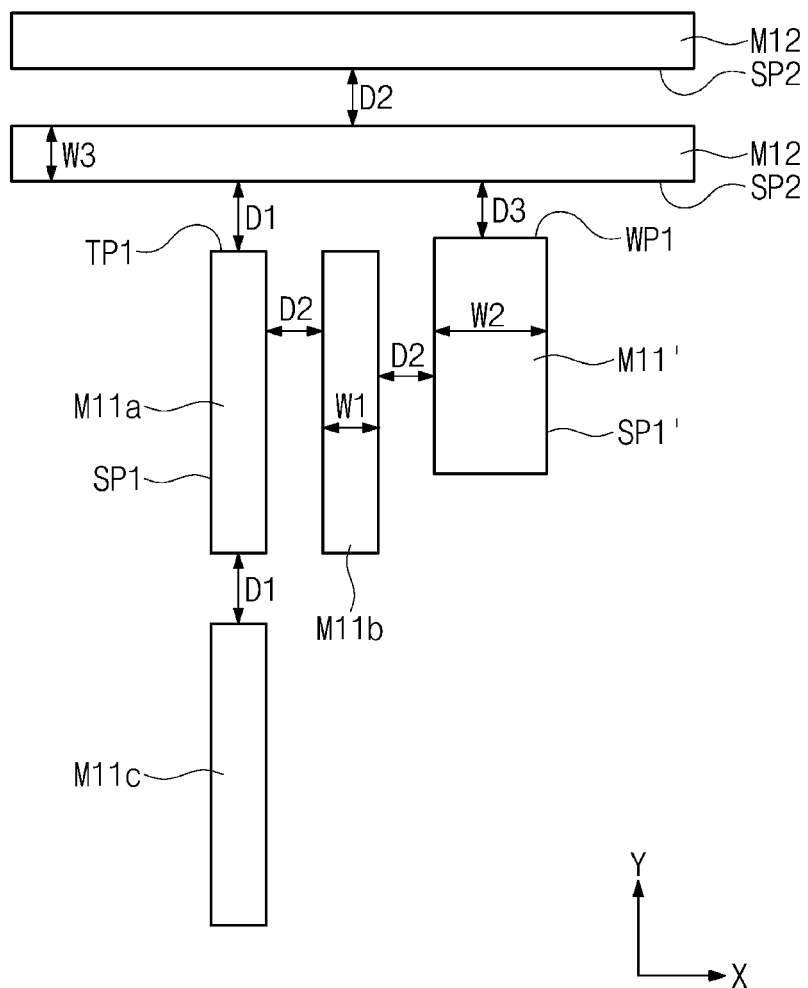
FIG. 4 is a plan view illustrating layout patterns for describing a method of designing a metal layout, according to example embodiments of the disclosure.

FIG. 4 is a plan view illustrating layout patterns for describing a method of designing a metal layout, according to example embodiments of the disclosure. In detail, FIG. 4 shows an example a first metal layout for realizing a first metal layer on a semiconductor substrate.

Referring to FIG. 4, first lower metal patterns M11, wide metal pattern M11', and second lower metal patterns M12 may be provided. Each of the first lower metal patterns M11 and the wide metal pattern M11' may be a line-shaped pattern extending in the first direction Y. Each of the second lower metal patterns M12 may be a line-shaped pattern extending in the second direction X crossing the first direction Y. The first lower metal patterns M11 may include first, second, and third sub patterns M11a, M11b, and M11c.

In detail, each of the first lower metal patterns M11 may include narrow horizontal sidewalls TP1 parallel to the second direction X and first vertical sidewalls SP1 parallel to the first direction Y. The wide metal pattern M11' may include wide horizontal sidewalls WP1 parallel to the second direction X and second vertical sidewalls SP1' parallel to the first direction Y. A length of the wide horizontal sidewalls WP1 of the wide metal pattern M11' may be greater than a length of the narrow horizontal sidewalls TP1 of the first lower metal pattern M11. A length of the second vertical sidewalls SP1' of the wide metal pattern M11' may be smaller than a length of the first vertical sidewalls SP1 of the first lower metal pattern M11. Each of the second lower metal patterns M12 may have second sidewalls SP2 parallel to the second direction X.

Each of the first lower metal patterns M11 may have a first line width W1 in the second direction X, and the wide metal pattern M11' may have a second line width W2 in the second direction X. Each of the second lower metal patterns M12 may have a third line width W3 in the first direction Y. In some embodiments, the first line width W1 may be substantially equal to the third line width W3. The second line width W2 may be greater than the first and third line widths W1 and W3. The first and third line widths W1 and W3 may correspond to a minimum line width, which is permitted under design rules for a corresponding layout design process. However, in certain embodiments, the first and third line widths W1 and W3 may be greater than the minimum line width. Furthermore, the first line width W1 may be substantially equal to the length of the narrow horizontal sidewalls TP1, and the second line width W2 may be substantially equal to the length of the wide horizontal sidewalls WP1.

The metal patterns M11, M11', and M12 may be spaced apart from each other in both the first and second directions Y and X. Here, the metal patterns M11, M11', and M12 may be spaced apart from each other by at least a minimum separation distance permitted under the design rules. The minimum separation distance may be defined by a limitation in a photolithography process, and moreover, it may be automatically defined by a layout design tool. As an example, the second lower metal patterns M12 may be spaced apart from each other by a second distance D2 in the first direction Y. Here, the second distance D2 may be the minimum separation distance, when the second lower metal patterns M12 are disposed most adjacent to each other. However, in certain embodiments, the second distance D2 may be greater than the minimum separation distance.

As previously described with reference to the OPC step (in S130) of FIG. 3, a shape of and distance between patterns may be distorted, when a photolithography process based on the layout patterns is performed. In particular, since the first lower metal patterns M11 have the narrow horizontal sidewalls TP1, a distance between the first lower metal pattern M11 and a pattern adjacent to the narrow horizontal sidewall TP1 may be greatly distorted. This is because the narrow horizontal sidewalls TP1 with a very small dimension lead to an increase in optical refraction. Accordingly, the distance between the pattern adjacent to the narrow horizontal sidewall TP1 and the first lower metal pattern M11 may be greater than the minimum separation distance.

As an example, the second lower metal pattern M12 and the third sub pattern M11c may be disposed adjacent to a pair of the narrow horizontal sidewalls TP1, respectively, of the first sub pattern M11a. In detail, one of the narrow horizontal sidewalls TP1 may face the second sidewall SP2 of the second lower metal pattern M12, and the other of the narrow horizontal sidewalls TP1 may face the narrow horizontal sidewall TP1 of the third sub pattern M11c. Here, the first sub pattern M11a and the second lower metal pattern M12 may be spaced apart from each other in the first direction Y by a first distance D1, and the first sub pattern M11a and the third sub pattern M11c may be spaced apart from each other in the first direction Y by the first distance D1. Here, the first distance D1 may be greater than the minimum separation distance (e.g., the second distance D2). For example, the first distance D1 may be equal to or greater than at least 1.2 times the minimum separation distance.

The second sub pattern M11b may be disposed adjacent to the first vertical sidewall SP1 of the first sub pattern M11a. The first vertical sidewall SP1 of the first sub pattern M11a may face the first vertical sidewall SP1 of the second sub pattern M11b. In the case where the first vertical sidewall SP1 is longer than the narrow horizontal sidewall TP1, it is possible to reduce distortion in the inter-pattern distance. Accordingly, the first and second sub patterns M11a and M11b may be spaced apart from each other in the second direction X by the minimum separation distance (e.g., the second distance D2).

Like the first lower metal patterns M11, the wide metal pattern M11' may be a line pattern extending in the first direction Y. However, unlike the first lower metal patterns M11, the wide metal pattern M11' may include a pair of wide horizontal sidewalls WP1. As an example, the second lower metal pattern M12 may be disposed adjacent to the wide horizontal sidewall WP1. Since the wide horizontal sidewall WP1 is relatively longer than the narrow horizontal sidewall TP1, it is possible to reduce distortion in the inter-pattern distance. Accordingly, the wide metal pattern M11' and the second lower metal pattern M12 may be spaced apart from each other in the first direction Y by a third distance D3. As an example, the third distance D3 may be substantially equal to the minimum separation distance (e.g., the second distance D2). As another example, the third distance D3 may be greater than the second distance D2 and smaller than the first distance D1.

To sum up, the first and second vertical sidewalls SP1 and SP1' and the second sidewalls SP2 may be spaced apart from a pattern adjacent thereto, by at least the minimum separation distance (e.g., D2). As an example, the first and second vertical sidewalls SP1 and SP1' and the second sidewalls SP2 may have a length greater than about 3 times the minimum line width (e.g., W1 and W3).

The narrow horizontal sidewalls TP1 may be spaced apart from a pattern adjacent thereto, by a separation distance (e.g., the first distance D1) greater than the minimum separation distance. As an example, the narrow horizontal sidewalls TP1 may have a length that is equal to or greater than the minimum line width (e.g., W1 and W3) and is smaller than about 2 times the minimum line width (e.g., W1 and W3).

The wide horizontal sidewalls WP1 may be spaced apart from a pattern adjacent thereto, by at least the minimum separation distance, and may have the smallest length, among sidewalls capable of satisfying such a separation requirement. As an example, the wide horizontal sidewalls WP1 may have a length that is about 2 to about 3 times the minimum line width (e.g., W1 and W3).

However, the disclosure is not limited to the above examples, and a length range of each of sidewalls of a pattern may be variously changed depending on given design rules.

Figure 5:
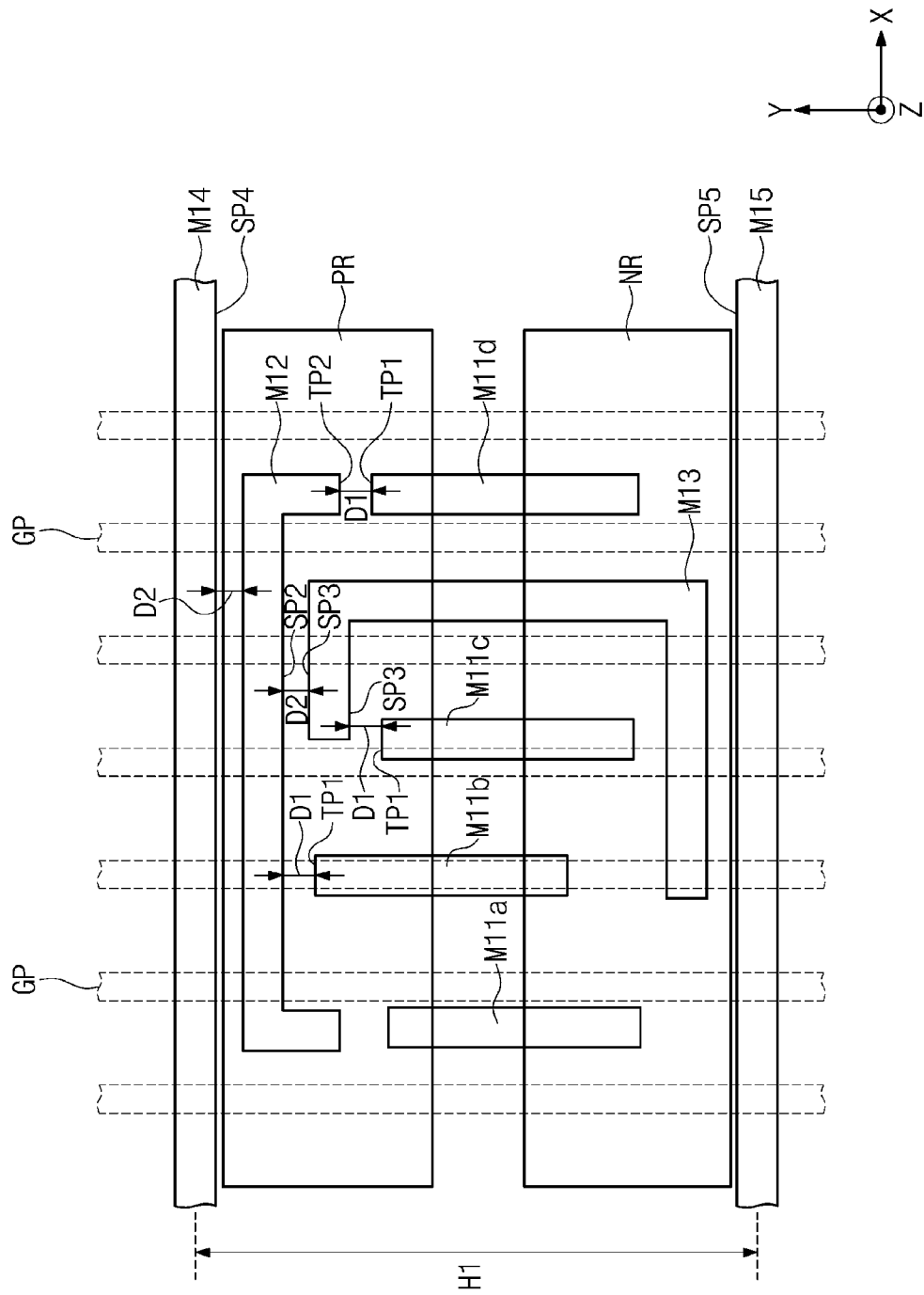
FIGS. 5 and 6 are plan views illustrating a logic cell layout, which is provided to describe a method of designing a metal layout, according to example embodiments of the disclosure.
Figure 6:
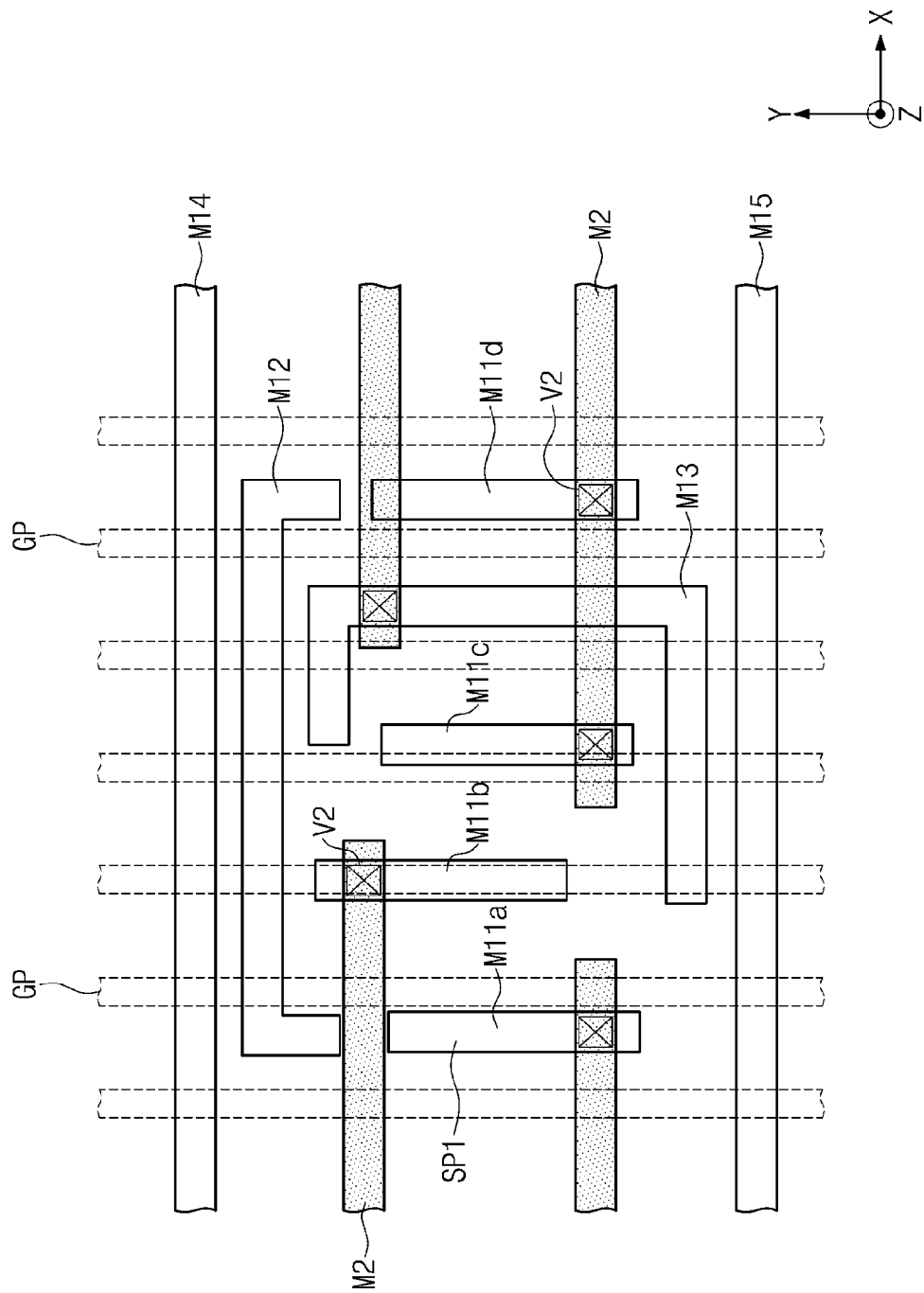

FIGS. 5 and 6 are plan views illustrating a logic cell layout, which is provided to describe a method of designing a metal layout, according to example embodiments of the disclosure. In detail, FIG. 5 illustrates a first metal layout for realizing a first metal layer provided on one of the logic cells of FIG. 2. FIG. 6 illustrates a second metal layout for realizing a second metal layer provided on the first metal layer. FIGS. 5 and 6 illustrate some examples, in which the first lower metal patterns M11 described with reference to FIG. 4 is provided, and the wide metal pattern M11' is omitted.

Referring to FIG. 5, layout patterns may be provided to define active regions. The active regions may include a PMOSFET region PR and an NMOSFET region NR. The PMOSFET and NMOSFET regions PR and NR may be spaced apart from each other in the first direction Y.

Gate patterns GP may be provided to extend in the first direction Y and to cross the PMOSFET and NMOSFET regions PR and NR. The gate patterns GP may be spaced apart from each other in the second direction X crossing the first direction Y.

In addition, although not shown, in the PMOSFET and NMOSFET regions PR and NR, layout patterns may be provided to define active patterns and source/drain regions, which will be formed on a semiconductor substrate. Furthermore, although not shown, layout patterns may be provided to define source/drain contacts and gate contacts, which will be connected to the first metal layer.

A first metal layout may be provided to define the first metal layer. The first metal layout may include first to fifth lower metal patterns M11, M12, M13, M14, and M15. The first to third lower metal patterns M11, M12, and M13 may be respectively used to define metal lines, each of which is electrically connected to the PMOSFET region PR, the NMOSFET region NR, or the gate patterns GP. The fourth and fifth lower metal patterns M14 and M15 may be used to define metal lines serving as paths for respectively transmitting a drain voltage (Vdd) (e.g., a power voltage) and a source voltage (Vss) (e.g., a ground voltage).

Each of the first lower metal patterns M11 may have a line shaped structure extending in the first direction Y and may have substantially the same features as that previously described with reference to FIG. 4. Each of the first lower metal patterns M11 may include narrow horizontal sidewalls TP1 and first vertical sidewalls SP1. The first lower metal patterns M11 may include first to fourth sub patterns M11a-M11d. The second to fifth lower metal patterns M12, M13, M14, and M15 may have second to fifth sidewalls SP2, SP3, SP4, and SP5, respectively, which are parallel to the second direction X.

The first to fifth lower metal patterns M11, M12, M13, M14, and M15 may be spaced apart from each other in both of the first and second directions Y and X. The logic cell illustrated in FIG. 5 may have a first height H1 in the first direction Y. The first height H1 may be a length from a center of the fourth lower metal pattern M14 to a center of the fifth lower metal pattern M15. The first height H1 may be a minimum cell height that is allowed under given design rules. Here, to meet the requirement for the minimum cell height, the first to fifth lower metal patterns M11, M12, M13, M14, and M15 may be spaced apart from each other in the first direction Y by a minimum separation distance permitted under the design rules.

For example, the fourth sidewall SP4 of the fourth lower metal pattern M14 may face the second sidewall SP2 of the second lower metal pattern M12, and here, the second and fourth lower metal patterns M12 and M14 may be spaced apart from each other in the first direction Y by a second distance D2. Here, the second distance D2 may be equal to the second distance D2 previously described with reference to FIG. 4 and may be the minimum separation distance.

The second and third lower metal patterns M12 and M13 may be provided in such a way that the second and third sidewalls SP2 and SP3 with relatively long lengths face each other. In this case, the second and third lower metal patterns M12 and M13 may be spaced apart from each other in the first direction Y by the second distance D2.

The second lower metal pattern M12 and the second sub pattern M11b may be provided in such a way that the second sidewall SP2 faces the narrow horizontal sidewall TP1 with a relatively short length. In this case, the second lower metal pattern M12 and the second sub pattern M11b may be spaced apart from each other in the first direction Y by a first distance D1. Here, the first distance D1 may be substantially equal to the first distance D1 described with reference to FIG. 4; that is, the first distance D1 may be equal to or greater than 1.2 times the minimum separation distance.

The second lower metal pattern M12 may include a portion extending in the first direction Y, and thus, the second lower metal pattern M12 may have a sidewall with a relatively short length. For example, the second lower metal pattern M12 may have a second narrow horizontal sidewall TP2 with such a relatively short length. The narrow horizontal sidewall TP1 of the fourth sub pattern M11d may face the second narrow horizontal sidewall TP2 of the second lower metal pattern M12. In this case, the second lower metal pattern M12 and the fourth sub pattern M11d may be spaced apart from each other in the first direction Y by the first distance D1.

The third lower metal pattern M13 and the third sub pattern M11c may be provided in such a way that the third sidewall SP3 faces the narrow horizontal sidewall TP1 with a relatively short length. In this case, the third lower metal pattern M13 and the third sub pattern M11c may be spaced apart from each other in the first direction Y by the first distance D1.

As a result, owing to the first lower metal patterns M11 with the narrow horizontal sidewalls TP1, it is necessary for the first lower metal patterns M11 to be separated from neighboring patterns adjacent thereto in the first direction Y by a specific separation distance (e.g., by the first distance D1). Accordingly, it is necessary for a minimum cell height (i.e., H1) of the logic cell to be greater than a specific value.

The first height H1 may be reduced by decreasing a length, in the first direction Y, of each of the first lower metal patterns M11. However, in this case, since the number of pin areas for a routing of the first lower metal patterns M11 decreases, technical issues associated with the routing may occur. In other words, there may be a limitation in reducing the length of each of the first lower metal patterns M11.

Referring to FIG. 6, a second metal layout may be provided on the first metal layout to define a second metal layer. For convenience in description, the active regions PR and NR described with reference to FIG. 5 are omitted.

The second metal layout may include intermediate metal patterns M2 extending in the second direction X and having a line-shaped structure. The intermediate metal patterns M2 may be connected to second vias V2, respectively, through the first to third lower metal patterns M11, M12, and M13.

Although not shown, additional metal layouts may be provided on the second metal layout. They may define additional metal layers stacked on the second metal layer. As a result, it is possible to sequentially perform a routing step of connecting data paths.

Figure 7:
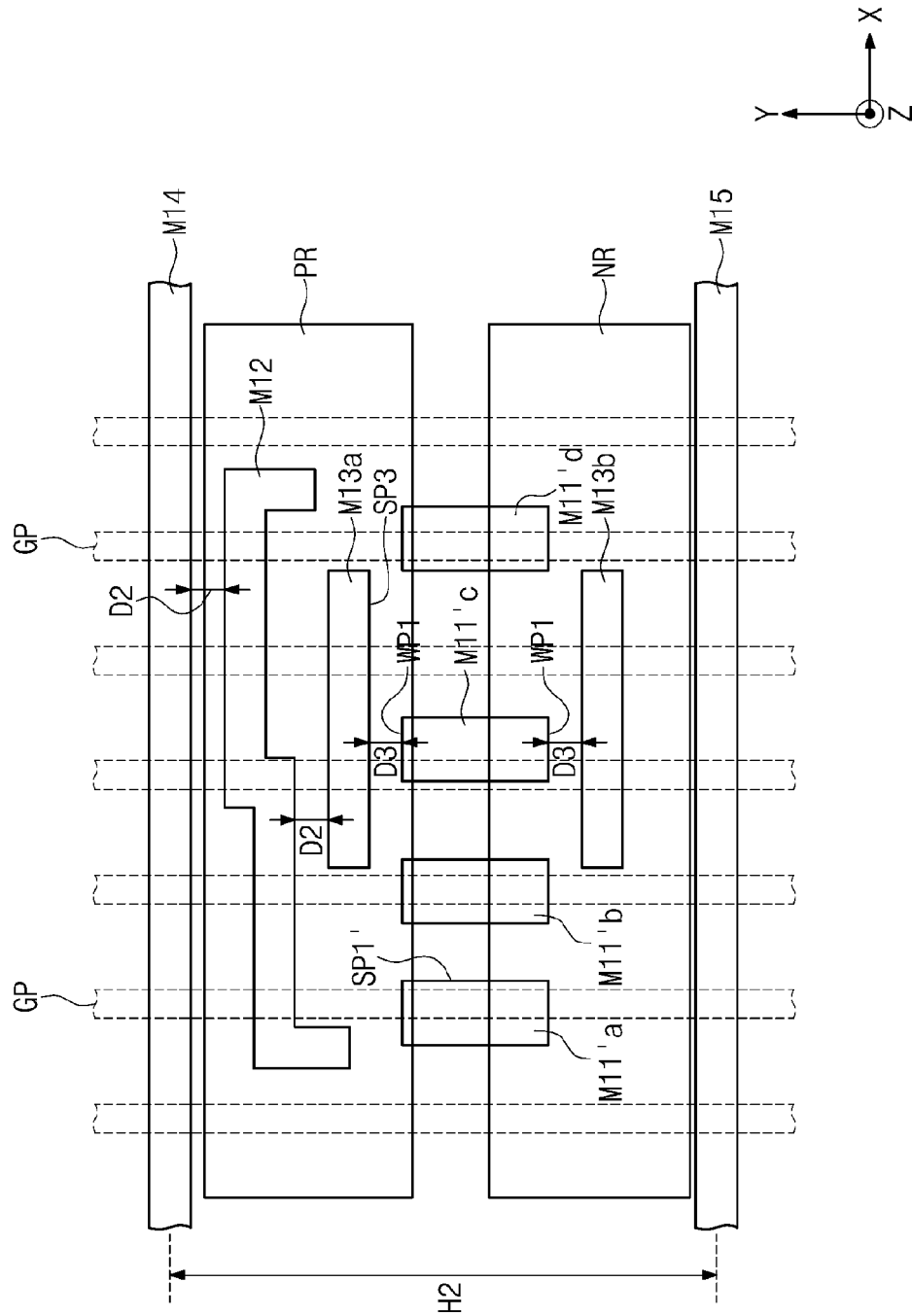
FIGS. 7, 8, and 10 are plan views illustrating a logic cell layout, which is provided to describe a method of designing a metal layout, according to other example embodiments of the disclosure.
Figure 8:
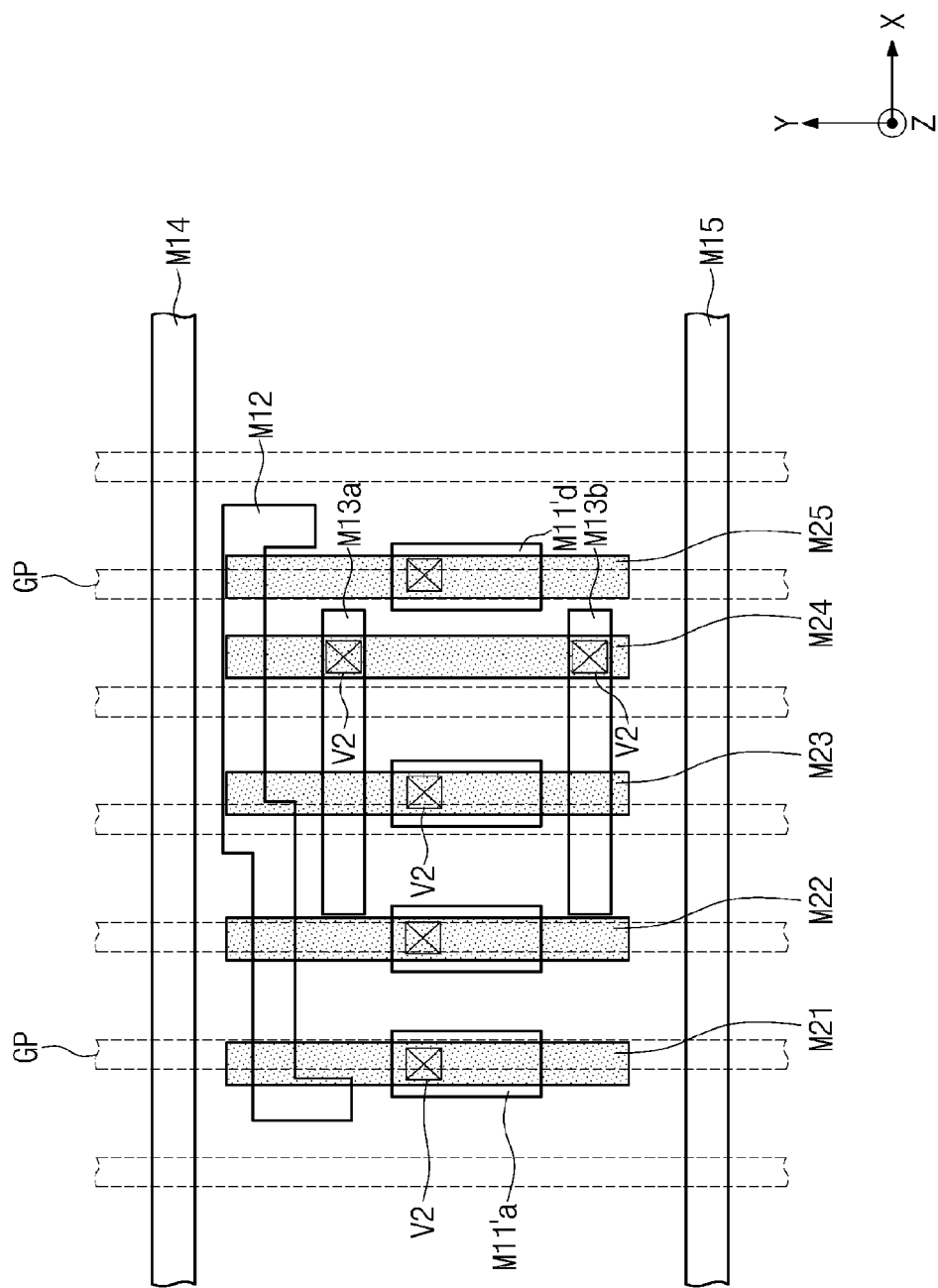
Figure 10:
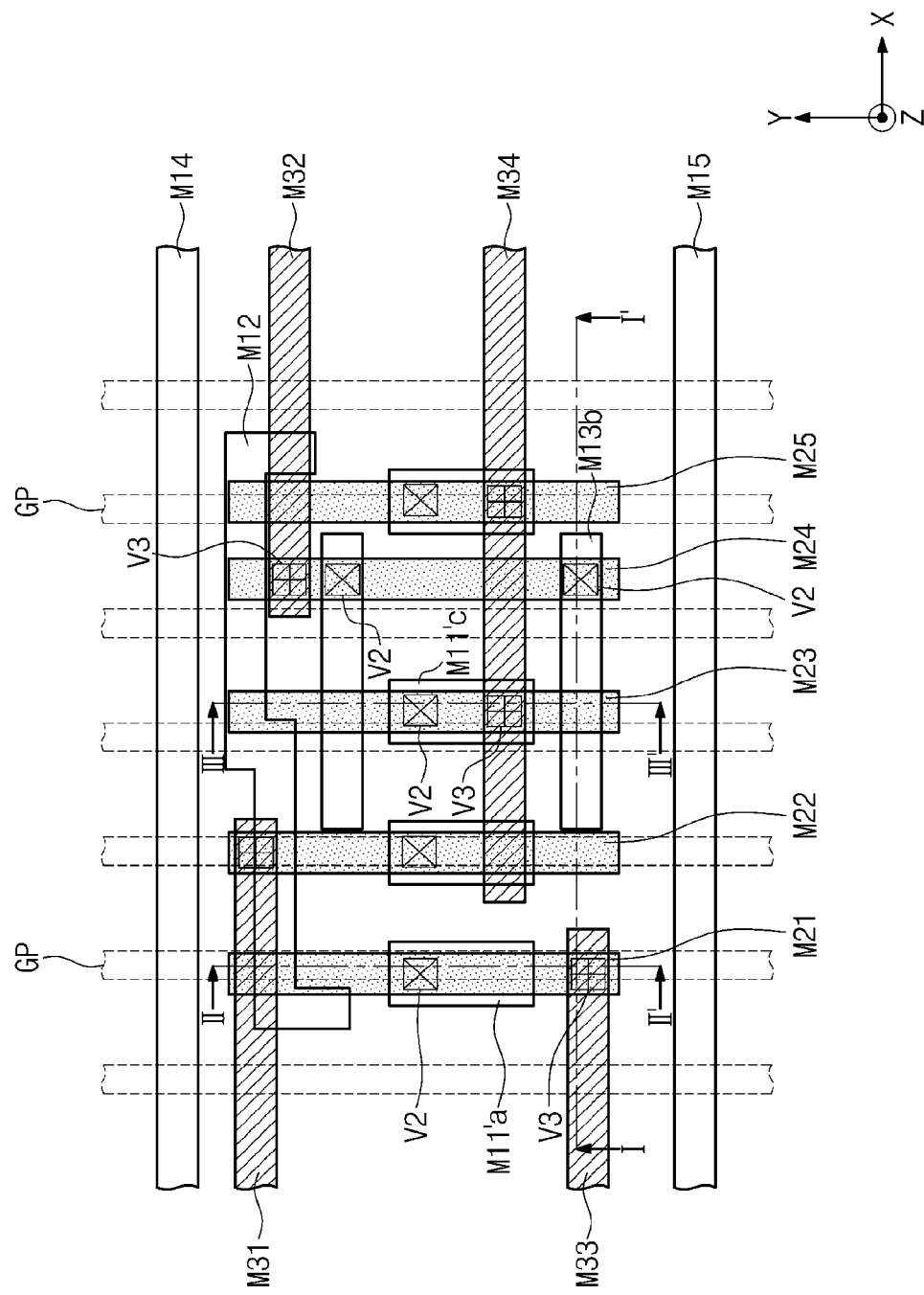

FIGS. 7, 8, and 10 are plan views illustrating a logic cell layout, which is provided to describe a method of designing a metal layout, according to other example embodiments of the disclosure. In detail, FIG. 7 illustrates a first metal layout for realizing a first metal layer provided on one of the logic cells of FIG. 2. FIG. 8 illustrates a second metal layout for realizing a second metal layer provided on the first metal layer. FIG. 10 illustrates a third metal layout for realizing a third metal layer on the second metal layer. FIGS. 7, 8, and 10 illustrate some examples, in which the wide metal pattern M11' described with reference to FIG. 4 is provided, and the first lower metal patterns M11 is omitted.

For concise description, an element previously described with reference to FIGS. 5 and 6 may be identified by a similar or identical reference number without repeating an overlapping description thereof.

Referring to FIG. 7, a first metal layout may be provided on the layout patterns including the gate patterns GP and the active regions PR and NR to define a first metal layer. The first metal layout may include wide metal patterns M11' and second to fifth lower metal patterns M12, M13, M14, and M15. The wide metal patterns M11' and the second and third lower metal patterns M12 and M13 may be respectively used to define metal lines, each of which is electrically connected to the PMOSFET region PR, the NMOSFET region NR, or the gate patterns GP.

Each of the wide metal patterns M11' may have a line shaped structure extending in the first direction Y and may have substantially the same features as that previously described with reference to FIG. 4. Each of the wide metal patterns M11' may include wide horizontal sidewalls WP1 and second vertical sidewalls SP1'. The wide metal patterns M11' may include first to fourth wide sub patterns M11'a-M11'd. The third lower metal patterns M13 may include first and second horizontal patterns M13a and M13b.

The logic cell illustrated in FIG. 7 may have a second height H2 in the first direction Y. The second height H2 may be a length from a center of the fourth lower metal pattern M14 to a center of the fifth lower metal pattern M15. The second height H2 may be a minimum cell height that is allowed under given design rules. Here, the second height H2 may be smaller than the first height H1 of FIG. 5. Here, a height of each of the PMOSFET and NMOSFET regions PR and NR may be smaller than that of the corresponding one of FIG. 5. In some embodiments, a space between the PMOSFET and NMOSFET regions PR and NR may be smaller than that between the corresponding regions of FIG. 5. In contrast to that described with reference to FIG. 5, the description that follows will refer to an example of the present embodiment in which the first metal layout is applied to a logic cell with the second height H2.

The wide metal patterns M11' and the second to fifth lower metal patterns M12, M13, M14, and M15 may be spaced apart from each other in the first and second directions Y and X. Here, to meet the requirement for the minimum cell height (i.e., H2), the wide metal patterns M11' and the second to fifth lower metal patterns M12, M13, M14, and M15 may be spaced apart from each other in the first direction Y by the minimum separation distance permitted under the design rules.

For example, the second and fourth lower metal patterns M12 and M14 may be spaced apart from each other in the first direction Y by a second distance D2. The first horizontal pattern M13a may be spaced apart from the second lower metal pattern M12 in the first direction Y by the second distance D2.

The first horizontal pattern M13a and the third wide sub pattern M11'c may be provided such that the third sidewall SP3 faces the wide horizontal sidewall WP1. In this case, the first horizontal pattern M13a and the third wide sub pattern M11'c may be spaced apart from each other in the first direction Y by a third distance D3. Here, the third distance D3 may be equal to the third distance D3 of FIG. 4. For example, the third distance D3 may be in a range from about 1 to about 1.2 times the minimum separation distance (i.e., D2).

The second horizontal pattern M13b and the third wide sub pattern M11'c may be provided in such a way that the third sidewall SP3 faces the wide horizontal sidewall WP1. In this case, the second horizontal pattern M13b and the third wide sub pattern M11'c may be spaced apart from each other in the first direction Y by the third distance D3.

As a result, owing to the wide metal patterns M11' with the wide horizontal sidewalls TP1, it is necessary for the wide metal patterns M11' to be separated from neighboring patterns adjacent thereto in the first direction Y by a specific separation distance (e.g., by the third distance D3). Since the third distance D3 is smaller than the first distance D1, it is possible to reduce a cell height (e.g., H2), compared with the case of the first lower metal patterns M11 of FIG. 5.

In addition, a length, in the first direction Y, of the wide metal patterns M11' may be smaller than that of the first lower metal patterns M11 of FIG. 5. Accordingly, the logic cell according to the present embodiment may have the second height H2. A routing issue, which may be caused by the reduction in length of the wide metal patterns M11', may be overcome by a second metal layout (e.g., a second metal layer) that will be described below.

Referring to FIG. 8, a second metal layout may be provided on the first metal layout to define a second metal layer. For convenience in description, the active regions PR and NR are omitted in FIG. 8.

The second metal layout may include first to fifth intermediate metal patterns M21-M25, each of which extends in the first direction Y and has a line shaped structure. The first, second, third, and fifth intermediate metal patterns M21-M23 and M25 may be respectively connected to second vias V2 through the first to fourth wide sub patterns M11'a-M11'd. The first, second, third, and fifth intermediate metal patterns M21-M23 and M25 may be extended in the first direction Y to provide sufficient pin areas for the routing.

Figure 9:
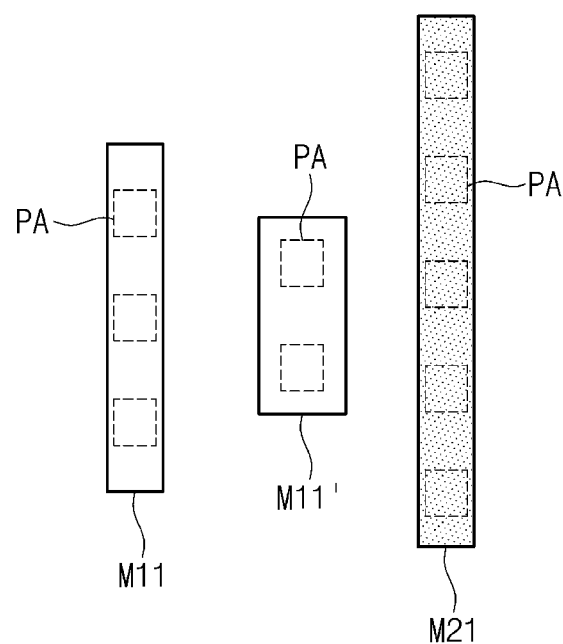
FIG. 9 is a plan view exemplarily illustrating pin areas of a first lower metal pattern, a wide metal pattern, and a first intermediate metal pattern, according to example embodiments of the disclosure.

FIG. 9 is a plan view exemplarily illustrating pin areas PA of the first lower metal pattern M11, the wide metal pattern M11', and the first intermediate metal pattern M21, according to example embodiments of the disclosure.

Referring to FIG. 9, the first lower metal pattern M11 may have three pin areas PA, and the wide metal pattern M11' may have two pin areas PA. In other words, since the first lower metal pattern M11 is longer than the wide metal pattern M11', the number of pin areas PA on the first lower metal pattern M11 may be greater than that of the wide metal pattern M11'. Each metal pattern may be connected to other metal pattern provided thereon through a via plug, and here, each of the pin areas PA may be a region, on which such a via plug will be formed. As described above, in the case where the number of the pin areas PA of the wide metal pattern M11' is less than that of the first lower metal pattern M11, the wide metal pattern M11' may make it difficult to perform the routing step.

Meanwhile, since the first intermediate metal pattern M21 is longer than the first lower metal pattern M11, five pin areas PA may be provided on the first intermediate metal pattern M21. Accordingly, if the first intermediate metal pattern M21 is connected to the wide metal pattern M11', it is possible to increase the number of the pin areas PA for the routing of the wide metal pattern M11'.

Referring back to FIG. 8, the first, second, third, and fifth intermediate metal patterns M21-M23 and M25 may be provided to deal with the shortage of the pin areas PA of the wide metal patterns M11'. The first, second, third, and fifth intermediate metal patterns M21-M23 and M25 may allow for the wide metal patterns M11' to perform the same routing as the first lower metal patterns M11 of FIG. 5.

The fourth intermediate metal pattern M24 may be connected in common to the first and second horizontal patterns M13a and M13b through the second vias V2 to electrically connect the first and second horizontal patterns M13a and M13b to each other. In other words, the fourth intermediate metal pattern M24 may allow for the first and second horizontal patterns M13a and M13b to perform the same routing as the third lower metal pattern M13 of FIG. 5.

Referring to FIG. 10, a third metal layout may be provided on the second metal layout to define a third metal layer.

The third metal layout may include first to fourth upper metal patterns M31-M34, each of which extends in the second direction X and has a line shaped structure. Each of the first to fourth upper metal patterns M31-M34 may be connected to a corresponding one of the first to fifth intermediate metal patterns M21-M25 through third vias V3.

Although not shown, additional metal layouts may be provided on the third metal layout. They may define additional metal layers stacked on the third metal layer. As a result, it is possible to sequentially perform a routing step of connecting data paths.

In the meantime, the metal layout according to the present embodiment is illustrated to further include an additional metal layer (e.g., the second metal layout), which is not illustrated in the metal layout of FIG. 6. However, since a semiconductor device generally includes seven or more metal layers stacked on a semiconductor substrate, by using at least one layer of the existing metal layers without any additional metal layer, it is possible to realize the routing on the basis of the metal layout according to the present embodiment.

In the present embodiment, a method of designing a layout for one logic cell has been exemplarily described, but, in order to reduce an overall height of cells, this method may be applied to a plurality of logic cells (or to a plurality of standard cells).

Each or some of the metal layouts, which have been described with reference to FIGS. 7, 8, and 10 or FIGS. 5 and 6, may be applied to other logic cells of FIG. 2. Furthermore, each or some of the metal layouts may be applied to at least one region in each of the processor cores described with reference to FIG. 1.

Figure 11:
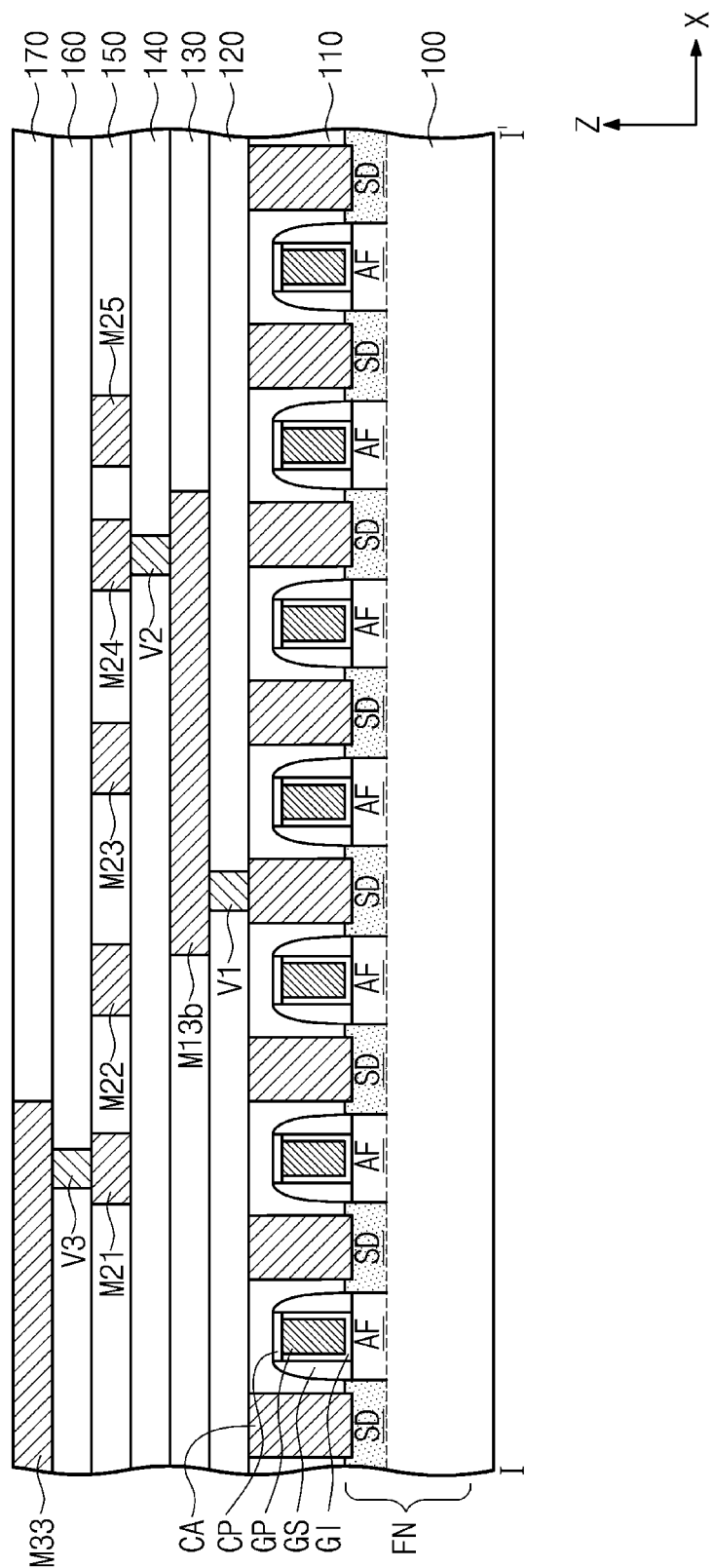
FIGS. 11 through 13 are sectional views taken along lines I-I', II-II', and III-III' of FIG. 10 to illustrate a semiconductor device according to example embodiments of the disclosure.
Figure 12:
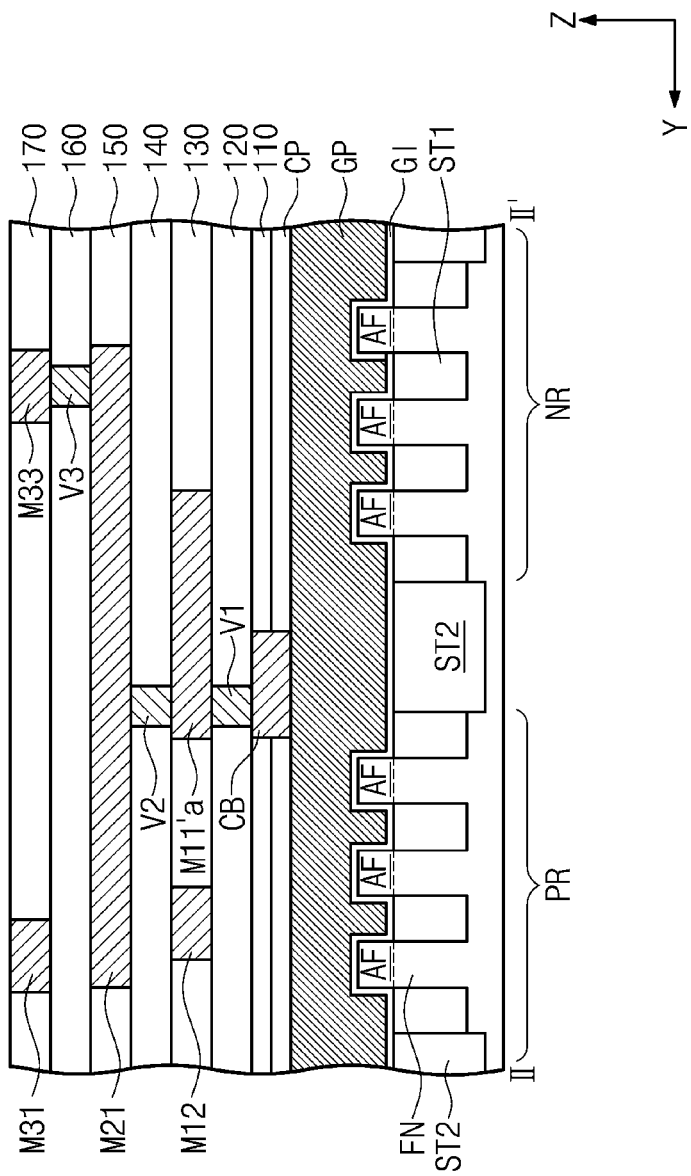
Figure 13:
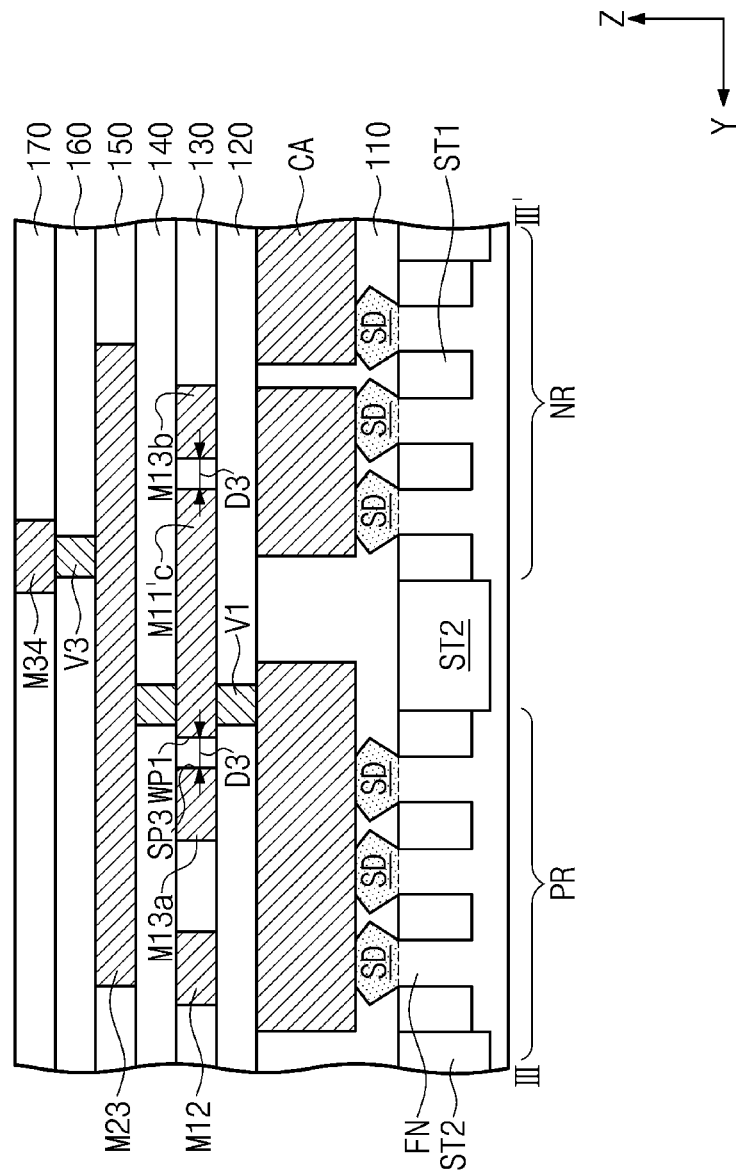

FIGS. 11 through 13 are sectional views taken along lines I-I', II-II', and III-III' of FIG. 10 to illustrate a semiconductor device according to example embodiments of the disclosure. In detail, FIGS. 11 through 13 illustrate some examples of semiconductor devices, which are fabricated on the basis of the layouts described with reference to FIGS. 7 through 10.

For concise description, in FIGS. 11 through 13, elements corresponding to the afore-described layout patterns may be identified by the same reference numbers. However, such elements refer to ones, which are actually integrated on a semiconductor substrate by the afore-described photolithography process, and thus, the layout patterns may differ from the corresponding elements of the semiconductor device. The semiconductor device may be, for example, a system-on-chip device.

Referring to FIGS. 10 and 11 through 13, the second device isolation layers ST2 may be provided on a substrate 100 to define the PMOSFET and NMOSFET regions PR and NR. The second device isolation layers ST2 may be formed in a top portion of the substrate 100. In example embodiments, the substrate 100 may be a silicon substrate, a germanium substrate, or a silicon-on-insulator (SOI) substrate.

The PMOSFET and NMOSFET regions PR and NR may be spaced apart from each other, in the first direction Y parallel to a top surface of the substrate 100, by the second device isolation layers ST2 interposed therebetween. In example embodiments, each of the PMOSFET and NMOSFET regions PR and NR is illustrated to be a single region, but it may include a plurality of regions spaced apart from each other by the second device isolation layers ST2.

A plurality of active patterns FN may be provided on the PMOSFET and NMOSFET regions PR and NR to extend in the second direction X crossing the first direction Y. The active patterns FN may be arranged along the first direction Y. First device isolation layers ST1 may be provided at both sides of each of the active patterns FN to extend in the second direction X. In example embodiments, each of the active patterns FN may include a fin-shaped portion positioned at an upper level thereof. As an example, the fin-shaped portion may protrude in an upward direction between the first device isolation layers ST1.

Although the number of the active patterns FN provided on each of the PMOSFET and NMOSFET regions PR and NR is shown to be three, example embodiments of the disclosure may not be limited thereto. The first device isolation layer ST1 may be connected to the second device isolation layers ST2 to form a single continuous insulating layer. In certain embodiments, the second device isolation layers ST2 may have a thickness greater than that of the first device isolation layers ST1. In this case, the first device isolation layers ST1 may be formed by a process different from that for the second device isolation layers ST2. In other embodiments, the first device isolation layers ST1 may be formed by the same process as that for the second device isolation layers ST2, thereby having substantially the same thickness as that of the second device isolation layers ST2. The first and second device isolation layers ST1 and ST2 may be formed in the upper portion of the substrate 100. The first and second device isolation layers ST1 and ST2 may be formed by a shallow-trench isolation (STI) process and may include, for example, a silicon oxide layer.

Gate patterns GP may be provided on the active patterns FN to cross the active patterns FN and extend parallel to the first direction Y. The gate patterns GP may be spaced apart from each other in the second direction X. Each of the gate patterns GP may extend parallel to the first direction Y to cross the PMOSFET region PR, the second device isolation layers ST2, and the NMOSFET region NR.

A gate insulating pattern GI may be provided below each of the gate patterns GP, and gate spacers GS may be provided at both sides of each of the gate patterns GP. Furthermore, a capping pattern CP may be provided to cover a top surface of each of the gate patterns GP. However, in certain embodiments, the capping pattern CP may be removed from a portion of the top surface of the gate pattern GP connected to a gate contact CB. First to seventh interlayered insulating layers 110 to 170 may be provided to cover the gate patterns GP.

The gate patterns GP may include at least one of doped semiconductors, metals, or conductive metal nitrides. The gate insulating pattern GI may include at least one of a silicon oxide layer, a silicon oxynitride layer, or a high-k dielectric layer whose dielectric constant is higher than that of a silicon oxide layer. At least one of the capping pattern CP and the gate spacers GS may include at least one of a silicon oxide layer, a silicon nitride layer, or a silicon oxynitride layer. Each of the first to seventh interlayered insulating layers 110 to 170 may include a silicon oxide layer or a silicon oxynitride layer.

Source/drain regions SD may be provided in portions of the active patterns FN positioned at both sides of each of the gate patterns GP. The source/drain regions SD may be locally formed in the active patterns FN, as shown in FIG. 13, but in certain embodiments, the source/drain regions SD may be extended into an upper portion of the substrate 100 (e.g., on the first device isolation layers ST1). The source/drain regions SD in the PMOSFET region PR may be p-type impurity regions, and the source/drain regions SD in the NMOSFET region NR may be n-type impurity regions. The fin-shaped portions, which are positioned below and overlapped with the gate patterns GP, may serve as channel regions AF of transistors.

The source/drain regions SD may be epitaxial patterns formed by a selective epitaxial growth process. Accordingly, the source/drain regions SD may have top surfaces positioned at a higher level than those of the fin portions. The source/drain regions SD may include a semiconductor element different from those of the substrate 100. As an example, the source/drain regions SD may be formed of or include a semiconductor material having a lattice constant different from (for example, greater or smaller than) the substrate 100. Accordingly, the source/drain regions SD may exert a compressive stress or a tensile stress on the channel regions AF. As an example, in the case where the substrate 100 is a silicon wafer, the source/drain regions SD of the PMOSFET region PR may be formed of or include a silicon-germanium (e-SiGe) or germanium layer. In this case, the source/drain regions SD may exert a compressive stress on the channel regions AF. As another example, in the case where the substrate 100 is a silicon wafer, the source/drain regions SD of the NMOSFET region NR may be formed of or include silicon carbide (SiC). In this case, the source/drain regions SD may exert a tensile stress on the channel regions AF. The compressive or tensile stress exerting on the channel regions AF may make it possible to increase mobility of carriers in the channel regions AF, when the transistors are operated.

Source/drain contacts CA may be provided between the gate patterns GP. The source/drain contacts CA may be arranged along the active patterns FN and in the second direction X. Also, the source/drain contacts CA may be arranged in the first direction Y and between the gate patterns GP. As an example, between the gate patterns GP, the source/drain contacts CA may be respectively provided on the PMOSFET and NMOSFET regions PR and NR and may be arranged in the first direction Y (e.g., see FIG. 13). The source/drain contacts CA may be directly coupled to and electrically connected to the source/drain regions SD. The source/drain contacts CA may be provided in the first interlayered insulating layer 110.

In example embodiments, on the PMOSFET region PR, three source/drain regions SD, which are spaced apart from each other in the first direction Y by the first device isolation layers ST1 interposed therebetween, may be electrically connected to each other by one of the source/drain contacts CA. For example, at least one of the source/drain contacts CA may cover a plurality of the active patterns FN in common and connect a plurality of the source/drain regions SD spaced apart from each other in the first direction Y (e.g., see FIG. 13).

The source/drain regions SD on the NMOSFET region NR may be connected to each other by the source/drain contacts CA, in the same manner as those on the PMOSFET region PR. For example, on the NMOSFET region NR, the source/drain regions SD, which are spaced apart from each other in the first direction Y by the first device isolation layers ST1, may be connected to each other by the source/drain contacts CA.

The gate contact CB may be provided on at least one of the gate patterns GP.

A second interlayered insulating layer 120 may be provided on the first interlayered insulating layer 110, and first vias V1 may be provided in the second interlayered insulating layer 120. A third interlayered insulating layer 130 may be provided on the second interlayered insulating layer 120, and a first metal layer may be provided in the third interlayered insulating layer 130. The first metal layer may include the wide metal patterns M11' and the second to fifth lower metal patterns M12, M13, M14, and M15 described with reference to FIG. 7.

In some embodiments, the second horizontal pattern M13b and the third wide sub pattern M11'c may be electrically and respectively connected to the source/drain contacts CA through the first via V1. The first wide sub pattern M11'a may be electrically connected to the gate contact CB through the first via V1.

Referring back to FIG. 13, each of the first horizontal pattern M13a and the second horizontal pattern M13b may be spaced apart from and the third wide sub pattern M11'c in the first direction Y by a third distance D3. As described above, this is because the third wide sub pattern M11'c has the wide horizontal sidewalls WP1 facing the third sidewalls SP3.

The fourth and fifth lower metal patterns M14 and M15 may be provided outside and adjacent to the PMOSFET and NMOSFET regions PR and NR, respectively. Although not shown, the fourth lower metal pattern M14 may be connected to the source/drain contact CA through the first via V1 to allow a drain voltage (Vdd) (e.g., a power voltage) to be applied to the PMOSFET region PR. The fifth lower metal pattern M15 may be connected to the source/drain contact CA through the first via V1 to allow a source voltage (Vss) (e.g., a ground voltage) to be applied to the NMOSFET region NR.

A fourth interlayered insulating layer 140 may be provided on the third interlayered insulating layer 130, and second vias V2 may be provided in the fourth interlayered insulating layer 140. A second metal layer may be provided in the fifth interlayered insulating layer 150 on the fourth interlayered insulating layer 140. The second metal layer may include the first to fifth intermediate metal patterns M21-M25 described with reference to FIG. 8. The first to fifth intermediate metal patterns M21-M25 may be electrically connected to the wide metal patterns M11' and the second and third lower metal patterns M12 and M13 through the second vias V2.

The sixth interlayered insulating layer 160 may be provided on the fifth interlayered insulating layer 150, and third vias V3 may be provided in the sixth interlayered insulating layer 160. A third metal layer may be provided in the seventh interlayered insulating layer 170 on the sixth interlayered insulating layer 160. The third metal layer may include the first to fourth upper metal patterns M31-M34 described with reference to FIG. 10. The first to fourth upper metal patterns M31-M34 may be electrically connected to the first to fifth intermediate metal patterns M21-M25 through the third vias V3.

The first to third metal layers may be formed using the methods of designing and fabricating a semiconductor device described with reference to FIG. 3. In detail, the high-level design process and the layout design process for a semiconductor integrated circuit may be performed to prepare the first to third metal layouts previously described with reference to FIGS. 7 through 10. Thereafter, the optical proximity correction step may be performed, and photomasks may be manufactured based on the modified metal layouts.

The formation of the first metal layer may include forming a photoresist pattern corresponding to the first metal layout, on the third interlayered insulating layer 130. In detail, a photoresist layer may be formed on the third interlayered insulating layer 130. By using a photomask corresponding to the first metal layout, exposure and development processes may be performed on the photoresist layer. As a result, the photoresist pattern may be formed. The photoresist pattern may be formed to have openings superimposed on metal line holes.

Thereafter, the third interlayered insulating layer 130 may be etched using the photoresist pattern as an etch mask to from metal line holes. Next, the wide metal patterns M11' and the second to fifth lower metal patterns M12, M13, M14, and M15 may be formed by filling the metal line holes with a conductive material. The conductive material may include a metallic material (e.g., copper).

The second and third metal layers may be formed by a method similar to that for the first metal layer.

Figure 14:
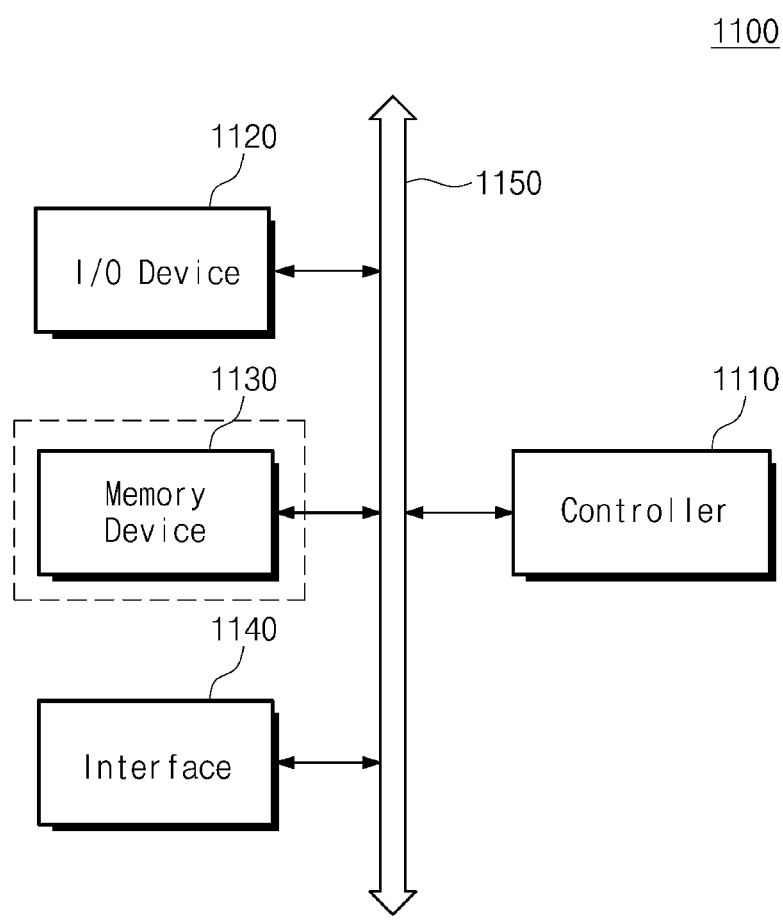
FIG. 14 is a block diagram illustrating an example of an electronic system including a semiconductor device according to example embodiments of the disclosure.

FIG. 14 is a block diagram illustrating an example of an electronic system including a semiconductor device according to example embodiments of the disclosure.

Referring to FIG. 14, an electronic system 1100 according to example embodiments of the disclosure may include a controller 1110, an input-output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device, which is configured to have a similar function to them. The I/O unit 1120 may include a keypad, a keyboard, or a display unit. The memory device 1130 may store data and/or commands. The memory device 1130 may include a nonvolatile memory device (e.g., a FLASH memory device, a phase-change memory device, a magnetic memory device, and so forth). Furthermore, the memory device 1130 may further include a volatile memory device. For example, the memory device 1130 may include a static random access memory (SRAM) device with the semiconductor device according to example embodiments of the disclosure. It may be possible to omit the memory device 1130, depending on the purpose of the electronic system 1100 or a type of an electronic product, for which the electronic system 1100 is used. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired and/or wireless communication. A semiconductor device according to example embodiments of the disclosure may be provided as a part of the controller 1110 or the I/O unit 1120. Although not shown in the drawings, the electronic system 1100 may further include a fast DRAM device and/or a fast SRAM device that acts as a cache memory for improving an operation of the controller 1110.

Figure 15:
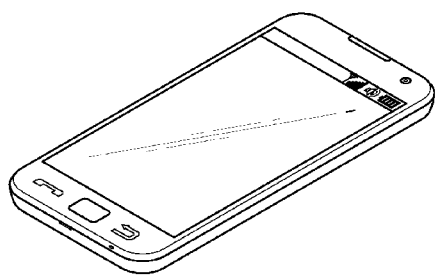
FIGS. 15 through 17 are diagrams illustrating some examples of a multimedia device including a semiconductor device according to example embodiments of the disclosure.
Figure 16:
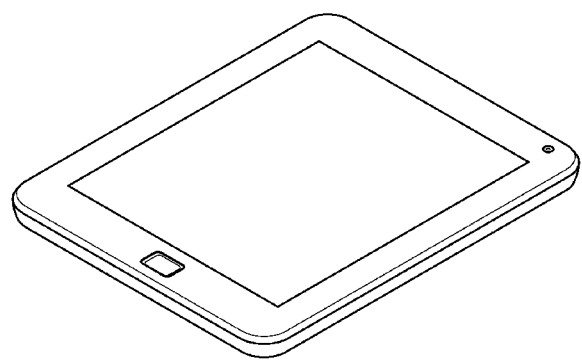
Figure 17:
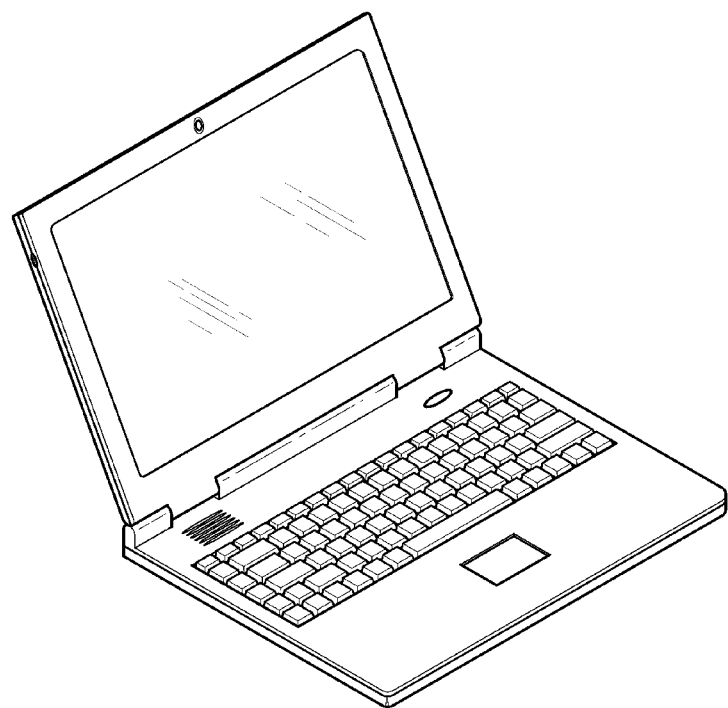

FIGS. 15 through 17 are diagrams illustrating some examples of a multimedia device including a semiconductor device according to example embodiments of the disclosure. The electronic device 1 of FIG. 1 and/or electronic system 1100 of FIG. 14 may be applied to a mobile or smart phone 2000 shown in FIG. 15, to a tablet PC or smart tablet PC 3000 shown in FIG. 16, or to a laptop computer 4000 shown in FIG. 17.

A system-on-chip device according to example embodiments of the disclosure and a layout thereof may be configured in such a way that a first metal layer includes wide metal lines, and thus, it is possible to reduce a space between metal line patterns and reduce a height of a cell. In addition, a second metal layer may be configured to provide pin areas, and thus, it is possible to increase a degree of freedom for realizing a schematic circuit and to effectively establish a routing.

While example embodiments of the disclosure have been particularly shown and described, it will be understood by one of ordinary skill in the art that variations in form and detail may be made therein without departing from the spirit and scope of the attached claims.

What is claimed is:

1. A system-on-chip device, comprising:
   a substrate with an active pattern;
   a gate electrode crossing the active pattern and extending in a first direction parallel to a top surface of the substrate; and
   a first metal layer electrically connected to the active pattern and the gate electrode, wherein:
   the first metal layer comprises:
      a first metal line extending in the first direction;
      a second metal line spaced apart from the first metal line in the first direction to extend in a second direction crossing the first direction;
      a third metal line extending in the second direction; and
      a fourth metal line spaced apart from the third metal line in the first direction and extending in the first direction,
   the first metal line comprises a first sidewall parallel to the second direction,
   the second metal line comprises a second sidewall parallel to the second direction,
   the first sidewall and the second sidewall face each other,
   the first sidewall has a length that is two or three times a minimum line width by a design rule for a layout,
   the third metal line comprises a third sidewall parallel to the second direction,
   the fourth metal line comprises a fourth sidewall parallel to the second direction,
   the third sidewall and the fourth sidewall face each other,
   the fourth sidewall has a length shorter than that of the first sidewall,
   the first sidewall and the second sidewall are spaced apart from each other by a first distance, and
   the third sidewall and the fourth sidewall are spaced apart from each other by a second distance greater than the first distance.

2. The device of claim 1, wherein the minimum line width is a minimum width, in the first direction, of the second metal line by the design rule.

3. The device of claim 1, wherein:
   the second metal line and the third metal line are spaced apart from each other in the first direction by a third distance, and
   the first distance is in a range from about 1 to about 1.2 times the third distance.

4. The device of claim 1, further comprising:
   a second metal layer on the first metal layer, wherein:
   the second metal layer comprises fifth metal lines extending in the first direction and parallel to each other, and
   one of the fifth metal lines is electrically connected to the first metal line to provide pin areas for a routing.

5. The device of claim 4, wherein:
   the second metal line comprises a plurality of metal line patterns spaced apart from each other in the first direction, and
   another of the fifth metal lines is disposed to electrically connect the metal line patterns spaced apart from each other.

6. The device of claim 4, further comprising:
   a third metal layer on the second metal layer, wherein:
   the third metal layer comprises sixth metal lines extending in the second direction and parallel to each other, and
   one of the sixth metal lines is coupled to one of the pin areas of the fifth metal lines and is electrically connected to the first metal line.

7. The device of claim 1, further comprising:
   source/drain regions formed in upper portions of the active pattern and at both sides of the gate electrode; and
   contacts respectively coupled to the gate electrode and the source/drain regions, wherein
   the first and second metal lines are electrically connected to the contacts.

8. A layout design method comprising:
   providing a layout pattern for forming a system-on-chip device, in which a plurality of standard cells is provided, wherein:
   the providing of the layout pattern comprises providing a first metal layout defining a first metal layer,
   the first metal layout comprises:
      a first pattern extending in a first direction, the first pattern having a first width in a second direction crossing the first direction;
      a second pattern spaced apart from the first pattern in the first direction to extend in the second direction, the second pattern having a second width in the first direction; and
      a third pattern spaced apart from the first pattern on an opposite side of the first pattern with respect to the first direction to extend in the second direction, the third pattern having the second width in the first direction;
   the first and second patterns, respectively, comprise first and second sidewalls facing each other,
   a distance between the first sidewall and the second sidewall is in a range from about 1 to about 1.2 times a minimum separation distance given by a design rule for a layout,
   the first and third patterns, respectively, comprise third and fourth sidewalls facing each other,
   a distance between the third and fourth sidewalls is in a range from about 1 to about 1.2 times a minimum separation distance given by a design rule for a layout.

9. The method of claim 8, wherein the length of the first sidewall is about 2 to about 3 times a minimum line width given by a design rule for the layout.

10. The method of claim 8, wherein:
    the length of the first sidewall is equal to or greater than a minimum sidewall length given by a design rule for the layout, allowing for the first sidewall to be spaced apart from the second sidewall by the minimum separation distance, and
    the length of the first sidewall is smaller than that of the second sidewall.

11. The method of claim 8, wherein the first metal layout further comprises:
    a fourth pattern extending in the first direction; and
    a fifth pattern spaced apart from the fourth pattern in the first direction to extend in the second direction, wherein:
    the fourth and fifth patterns, respectively, comprise fifth and sixth sidewalls facing each other,
    a length of the fifth sidewall is smaller than that of the first sidewall, and
    a distance between the fifth and sixth sidewalls is greater than a distance between the first and second sidewalls.

12. The method of claim 11, wherein the length of the fifth sidewall is in a range from about 1 to about 2 times a minimum line width given by a design rule of the layout.

13. The method of claim 8, wherein:
the providing of the layout pattern further comprises providing a second metal layout defining a second metal layer and providing a third metal layout defining a third metal layer,
the first to third metal layers are sequentially stacked on a substrate,
the second metal layout comprises fourth patterns extending in the first direction and parallel to each other,
the third metal layout comprises fifth patterns extending in the second direction and parallel to each other, and
the first direction is an extension direction of a gate pattern.

14. The method of claim 13, wherein at least one of the fourth patterns is overlapped with the first pattern and comprises a plurality of pin areas for a routing.

15. A logic cell comprising:
a substrate with an active pattern for the logic cell; and
a source/drain electrode crossing the active pattern and extending in a first direction parallel to a top surface of the substrate, wherein:
the first metal layer comprises:
  a first metal line having a first width in the first direction;
  a second metal line that is spaced apart from the first metal line in the first direction by about a minimum spacing according to a layout design rule and having a second width in the first direction that is about one-third the first width or less and about the same as a minimum line width according to the layout design rule, and
  a third metal line that is spaced apart from the first metal line on an opposite side of the first metal line with respect to the first direction by the minimum spacing and having the second width in the first direction, wherein:
the first metal line is directly and electrically connected to the source/drain electrode through a first via extending through a first insulating layer disposed between the source/drain electrode and the first metal layer, and
the first metal line is not electrically connected to either of the second and third metal lines through metal connectivity.

16. The logic cell of claim 15, further comprising:
a second metal layer disposed over the first metal layer and separated from the first metal layer by a second insulating layer, wherein
the second and third metal lines are directly and electrically connected by the second metal layer and second and third vias extending respectively from each of the second and third metal lines to the second metal layer through the second insulating layer.

17. The logic cell of claim 16, further comprising:
a third metal layer comprising:
  a fourth metal line that is directly and electrically connected to the second metal layer through a fourth via extending through a third insulating layer disposed between the second and third metal layers, and
  a fifth metal line that is directly and electrically connected to the first metal line through a fifth via extending through the third insulating layer, wherein
the fourth and fifth metal lines are not electrically connected through metal connectivity.

18. The logic cell of claim 17, further comprising:
a gate electrode crossing the active pattern in the first direction parallel to the top surface of the substrate, wherein:
the first metal layer further comprises a sixth metal line having the same dimensions and spatial orientation as the first metal line, wherein the first metal line is directly and electrically connected to a contact of the gate electrode through a sixth via extending through the first insulating layer, which is disposed between the gate electrode and the first metal layer.

19. The logic of claim 18, wherein:
the second metal layer further comprises a seventh metal line that is directly and electrically connected to the sixth metal line through a seventh via extending through the second insulating layer, and
the third metal layer further comprises an eighth metal line that is directly and electrically connected to the seventh metal line through an eighth via extending through the third insulating layer.

* * * * *